(12) United States Patent
Mokhti et al.

(10) Patent No.: US 10,748,996 B2
(45) Date of Patent: *Aug. 18, 2020

(54) HIGH POWER TRANSISTOR WITH INTERIOR-FED GATE FINGERS

(71) Applicant: Cree, Inc., Durham, NC (US)

(72) Inventors: Zulhazmi Mokhti, Morgan Hill, CA (US); Frank Trang, San Jose, CA (US); Haedong Jang, San Jose, CA (US)

(73) Assignee: Cree, Inc., Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/596,240

(22) Filed: Oct. 8, 2019

(65) Prior Publication Data

US 2020/0044024 A1    Feb. 6, 2020

Related U.S. Application Data

(63) Continuation of application No. 16/032,571, filed on Jul. 11, 2018, now Pat. No. 10,483,352.

(51) Int. Cl.
| | |
|---|---|
| *H01L 23/52* | (2006.01) |
| *H01L 29/06* | (2006.01) |
| *H01L 29/417* | (2006.01) |
| *H03F 3/195* | (2006.01) |
| *H01L 23/528* | (2006.01) |

(Continued)

(52) U.S. Cl.
CPC ...... *H01L 29/0696* (2013.01); *H01L 23/5283* (2013.01); *H01L 29/41758* (2013.01); *H01L 29/4238* (2013.01); *H03F 3/195* (2013.01); *H01L 23/52* (2013.01); *H01L 23/522* (2013.01);

(Continued)

(58) Field of Classification Search
CPC . H01L 23/5226; H01L 23/528; H01L 23/522; H03F 3/195
See application file for complete search history.

(56) References Cited

U.S. PATENT DOCUMENTS

| | | |
|---|---|---|
| 4,498,093 A | 2/1985 | Allyn |
| 4,721,986 A | 1/1988 | Kinzer |

(Continued)

FOREIGN PATENT DOCUMENTS

| | | |
|---|---|---|
| JP | 2013247618 | 12/2013 |

OTHER PUBLICATIONS

Trang et al., U.S. Appl. No. 16/208,821, filed Dec. 4, 2018.

(Continued)

*Primary Examiner* — Nicholas J Tobergte
(74) *Attorney, Agent, or Firm* — Myers Bigel, P.A.

(57) ABSTRACT

A transistor device includes a semiconductor structure, a plurality of gate fingers extending on the semiconductor structure in a first direction, a plurality of gate interconnects that each have a first end and a second end extending on the semiconductor structure in the first direction, wherein each gate interconnect is connected to a respective gate finger by a plurality of first conductive vias, and a plurality of gate runners extending on the semiconductor structure in the first direction. At least one gate interconnect of the gate interconnects is connected to one of the gate runners by a second conductive via at an interior position of the at least one gate interconnect that is remote from the first end and the second end of the at least one gate interconnect.

20 Claims, 13 Drawing Sheets

(51) Int. Cl.
*H01L 29/423* (2006.01)
*H01L 23/522* (2006.01)

(52) U.S. Cl.
CPC ...... *H01L 23/5221* (2013.01); *H01L 23/5226* (2013.01)

(56) References Cited

U.S. PATENT DOCUMENTS

| | | | |
|---|---|---|---|
| 5,025,296 | A | 6/1991 | Fullerton |
| 5,430,247 | A | 7/1995 | Bockelman |
| 5,500,522 | A | 3/1996 | Eshraghian |
| 5,592,006 | A | 1/1997 | Merrill |
| 6,023,086 | A | 2/2000 | Reyes |
| 6,274,896 | B1 | 8/2001 | Gibson |
| 6,316,793 | B1 | 11/2001 | Sheppard |
| 6,507,047 | B2 | 1/2003 | Litwin |
| 6,765,268 | B2 | 7/2004 | Akamine |
| 6,900,482 | B2 | 5/2005 | Aoki |
| 7,135,747 | B2 | 11/2006 | Allen |
| 7,851,832 | B2 | 12/2010 | Takagi |
| 7,906,799 | B2 | 3/2011 | Sheppard |
| 8,076,994 | B2 | 12/2011 | Farrell |
| 8,178,908 | B2 | 5/2012 | Greenberg |
| 8,536,622 | B2 | 9/2013 | Takemae |
| 8,860,093 | B2 | 10/2014 | Sasaki |
| 8,866,197 | B2 | 10/2014 | Becker |
| 8,872,279 | B2 | 10/2014 | Greenberg et al. |
| 9,190,479 | B1 | 11/2015 | Greenberg |
| 9,653,410 | B1 | 5/2017 | Holmes et al. |
| 9,741,673 | B2 | 8/2017 | Andre |
| 9,786,660 | B1 | 10/2017 | Farrell |
| 9,979,361 | B1 | 5/2018 | Mangaonkar et al. |
| 10,270,402 | B1 | 4/2019 | Holmes et al. |
| 10,483,352 | B1 * | 11/2019 | Mokhti ............. H01L 29/41758 |
| 2001/0012671 | A1 | 8/2001 | Hoshino |
| 2002/0033508 | A1 | 3/2002 | Morikawa |
| 2002/0039038 | A1 | 4/2002 | Miyazawa |
| 2002/0066908 | A1 | 6/2002 | Smith |
| 2002/0167023 | A1 | 11/2002 | Chavarkar |
| 2003/0102482 | A1 | 6/2003 | Saxler |
| 2004/0061129 | A1 | 4/2004 | Saxler |
| 2006/0081985 | A1 | 4/2006 | Beach |
| 2008/0100404 | A1 | 5/2008 | Vice |
| 2008/0157222 | A1 | 7/2008 | Wang |
| 2009/0020848 | A1 | 1/2009 | Ono |
| 2009/0108357 | A1 | 4/2009 | Takagi |
| 2009/0212846 | A1 | 8/2009 | Cutter |
| 2009/0278207 | A1 | 11/2009 | Greenberg |
| 2011/0018631 | A1 | 1/2011 | Ng |
| 2011/0102077 | A1 | 5/2011 | Lamey |
| 2012/0012908 | A1 | 1/2012 | Matsunaga |
| 2012/0199847 | A1 | 8/2012 | Takagi |
| 2012/0267795 | A1 | 10/2012 | Shimura |
| 2013/0099286 | A1 | 4/2013 | Imada |
| 2013/0228787 | A1 | 9/2013 | Yamamura |
| 2013/0313653 | A1 | 11/2013 | Brech |
| 2014/0014969 | A1 | 1/2014 | Kunii |
| 2015/0129965 | A1 | 5/2015 | Roy |
| 2015/0145025 | A1 | 5/2015 | Yoshida et al. |
| 2015/0311131 | A1 | 10/2015 | Watts et al. |
| 2015/0349727 | A1 | 12/2015 | Flowers et al. |
| 2016/0380606 | A1 | 12/2016 | Limjoco et al. |
| 2017/0271329 | A1 | 9/2017 | Farrell |
| 2017/0271497 | A1 | 9/2017 | Fayed |
| 2020/0075479 | A1 | 3/2020 | Khalil et al. |

OTHER PUBLICATIONS

Notification of Transmittal of the International Search Report and the Written Opinion of the International Searching Authority, or the Declaration, dated Dec. 13, 2019 for corresponding International Application No. PCT/US2019/040960.

International Search Report and Written Opinion for PCT/US2019/063961 dated Mar. 16, 2020, 14 pages.

* cited by examiner

HIGH POWER TRANSISTOR WITH INTERIOR-FED GATE FINGERS

CROSS-REFERENCE TO RELATED APPLICATION

This application is a continuation of U.S. patent application Ser. No. 16/032,571, filed Jul. 11, 2018, entitled "HIGH POWER TRANSISTOR WITH INTERIOR-FED GATE FINGERS", the disclosure of which is hereby incorporated herein by reference in its entirety as if set forth fully herein.

FIELD

The inventive concepts described herein relate to microelectronic devices and, more particularly, to high power, high frequency transistors having unit cell-based structures.

BACKGROUND

Electrical circuits requiring high power handling capability while operating at high frequencies, such as radio frequencies (500 MHz), S-band (3 GHz) and X-band (10 GHz), have in recent years become more prevalent. Because of the increase in high power, high frequency circuits, there has been a corresponding increase in demand for transistors which are capable of reliably operating at radio and microwave frequencies while still being capable of handling higher power loads.

To provide increased output power, transistors with larger gate peripheries have been developed. One technique for increasing the effective gate periphery of a transistor is to provide a plurality of transistor cells that are connected in parallel in a unit cell configuration. For example, a high power transistor may include a plurality of gate fingers that extend in parallel between respective elongated source and drain contacts, as illustrated in FIG. 1.

In particular, FIG. 1 illustrates a metal layout of a conventional semiconductor transistor device 10 that includes a gate pad 12 and a drain pad 32 on a semiconductor substrate 20. FIG. 1 is a plan view of the device (i.e., looking down at the device from above). As shown in FIG. 1, in the conventional semiconductor transistor device 10, the gate pad 12 is connected by a gate bus 14 to a plurality of parallel gate fingers 16 that are spaced apart from each other along a first direction (e.g., the Y-direction indicated in FIG. 1) and extend in a second direction (e.g., the X-direction indicated in FIG. 1). The drain pad 32 is connected to a plurality of drain contacts 36 via a drain bus 34. In addition, source contacts 26 may also be located on the semiconductor transistor device 10. Each gate finger 16 runs along the X-direction between a pair of adjacent source and drain contacts 26, 36. A unit cell of the semiconductor transistor device 10 is illustrated at box 40, and includes a gate finger 16 that extends between adjacent source and drain contacts 26, 36. The "gate length" refers to the distance of the gate metallization in the Y-direction, while the "gate width" is the distance by which the source and drain contacts 26, 36 overlap in the X-direction. That is, "width" of a gate finger 16 refers to the dimension of the gate finger 16 that extends in parallel to the adjacent source/drain contacts 26, 36 (the distance along the X-direction). The gate periphery of the device refers to the sum of the gate widths for each gate finger 16 of the semiconductor transistor device 10.

In addition to adding unit cells, the gate periphery of a multi-cell transistor device may be increased by making the gate fingers wider (i.e., longer in the X-direction). As the gate fingers of a device become wider, however, the high frequency performance of the device may be adversely impacted. In addition, making the gate fingers wider typically means that the gate fingers must handle increased current levels, which can cause electromigration of the gate finger metallization.

SUMMARY

Pursuant to some embodiments of the present invention, transistor devices are provided that include a semiconductor structure, a plurality of gate fingers extending on the semiconductor structure in a first direction, a plurality of gate interconnects that each have a first end and a second end extending on the semiconductor structure in the first direction, where each gate interconnect is connected to a respective gate finger by a plurality of first conductive vias, and a plurality of gate runners extending on the semiconductor structure in the first direction. At least one of the gate interconnects is connected to one of the gate runners by a second conductive via that is located at an interior position of the at least one gate interconnect that is remote from the first end and the second end of the at least one gate interconnect.

In some embodiments, respective ones of the gate fingers may be configured to act as a gate electrode for the transistor device.

In some embodiments, the gate fingers may extend on the semiconductor structure at a first level above the semiconductor structure, the gate interconnects may extend on the semiconductor structure at a second level above the semiconductor structure that is higher than the first level, and the gate runners may extend on the semiconductor structure at a third level above the semiconductor structure that is higher than the second level.

In some embodiments, the interior position of the at least one gate interconnect may be between one-third and two-thirds of a distance between the first end and the second end of the at least one gate interconnect. In some embodiments, the interior position of the at least one gate interconnect may be at a halfway point between the first end and the second end of the at least one gate interconnect.

In some embodiments, a first of the gate fingers may include a first segment and a second segment, with a gap therebetween. In such embodiments, the interior position of the at least one the gate interconnects may vertically overlap the gap.

In some embodiments, the transistor device may further include a gate manifold on the semiconductor structure that is connected to the gate runners. The gate manifold may extend on the semiconductor structure in a second direction crossing the first direction.

In some embodiments, the gate runners may be first gate runners, each first gate runner having a third end and a fourth end, and the interior position may be a first interior position, and the transistor device may further include a plurality of second gate runners that extend on the semiconductor structure in the first direction. In such embodiments, at least one second gate runner may be connected to a first gate runner by a third conductive via, the third conductive via connected to the first gate runner at a second interior position of the first gate runner that may be remote from the third end and the fourth end of the first gate runner. The gate manifold may be connected to the first gate runners through respective ones of the second gate runners.

In some embodiments, the interior position may be a first interior position and the transistor device may further include a plurality of drain fingers extending on the semiconductor structure in the first direction, a plurality of drain interconnects that each has a third end and a fourth end extending on the semiconductor structure in the first direction, where each drain interconnect is connected to a respective drain finger by a plurality of third conductive vias, and a plurality of drain runners extending on the semiconductor structure in the first direction. A second interior position of at least one drain interconnect that is remote from the third end and the fourth end of the at least one drain interconnect may be connected to a drain runner by a fourth conductive via, and a drain manifold may be provided on the semiconductor structure and connected to the plurality of drain runners.

Pursuant to further embodiments of the present invention, transistor devices are provided that include a semiconductor structure, a plurality of source regions and a plurality of drain regions alternately arranged on the semiconductor structure, a plurality of gate fingers extending respectively at a first level above the semiconductor structure between adjacent ones of the source regions and the drain regions, a plurality of gate interconnects on the semiconductor structure at a second level above the semiconductor structure that is higher than the first level, wherein each of the gate interconnects is connected to a respective gate finger by a plurality of first conductive vias, and a plurality of gate runners on the semiconductor structure at a third level above the semiconductor structure that is higher than the second level. At least one of the gate runners is connected to at least one of the gate interconnects by a second conductive via, the second conductive via connecting to the at least one of the gate interconnects at a first interior position on the at least one of the gate interconnects that overlaps an adjacent source region.

In some embodiments, the first interior position may be between one-third and two-thirds of a distance between a first end and a second end of the at least one of the gate interconnect.

In some embodiments, the transistor device may further include a gate manifold on the semiconductor structure that is connected to the gate runners, and the plurality of gate runners may be first gate runners, each first gate runner having a third end and a fourth end. In some such embodiments, the transistor device may further include a plurality of second gate runners extending on the semiconductor structure, where a second gate runner may be connected to the at least one of the first gate runners by a third conductive via, the third conductive via connected to the at least one of the first gate runners at a second interior position of the at least one of the first gate runners that is remote from the third end and the fourth end of the at least one of the first gate runners. The gate manifold may be connected to the plurality of first gate runners through respective ones of the plurality of second gate runners.

In some embodiments, a width of the at least one of the gate runners may exceed a width of the at least one of the gate interconnects.

In some embodiments, the transistor device may further include a plurality of drain fingers respectively on the plurality of drain regions, a plurality of drain interconnects on the semiconductor structure, where each of the drain interconnects is connected to a respective drain finger by a plurality of third conductive vias, a plurality of drain runners on the semiconductor structure, where at least one of the drain runners is connected to at least one of the drain interconnects by a fourth conductive via connecting to the at least one of the drain interconnects at a second interior position on the at least one of the drain interconnects that overlaps an adjacent source region, and a drain manifold on the semiconductor structure and connected to the drain runners. In some embodiments, the gate runners may be at a different level above the semiconductor structure than the at least one of the drain runners.

Pursuant to still further embodiments of the present invention, transistor devices are provided that include a semiconductor structure, a plurality of gate fingers extending on the semiconductor structure, a plurality of gate interconnects on the semiconductor structure, each of the gate interconnects electrically coupled to respective ones of the gate lingers, wherein each gate interconnect has a first end and a second end, and a plurality of gate runners on the semiconductor structure, wherein at least one of the gate runners is connected to at least one of the gate interconnects by a conductive via, where current received at the first end of the at least one of the gate interconnects via the conductive via has less than 1 degree phase difference from current received at the second end of the at least one of the gate interconnects via the conductive via.

In some embodiments, the gate runners and the gate interconnects may extend in a first direction, and a first dimension of the at least one of the gate runners in a second direction that crosses the first direction may exceed a second dimension of the at least one of the gate interconnects in the second direction.

In some embodiments, the conductive via may be connected to an interior position of the at least one of the gate interconnects that is between one-third and two-thirds of a distance between the first end and the second end of the at least one of the gate interconnects.

In some embodiments, a first of the gate fingers may comprise a first segment and a second segment, with a gap therebetween.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION

Figure 1:
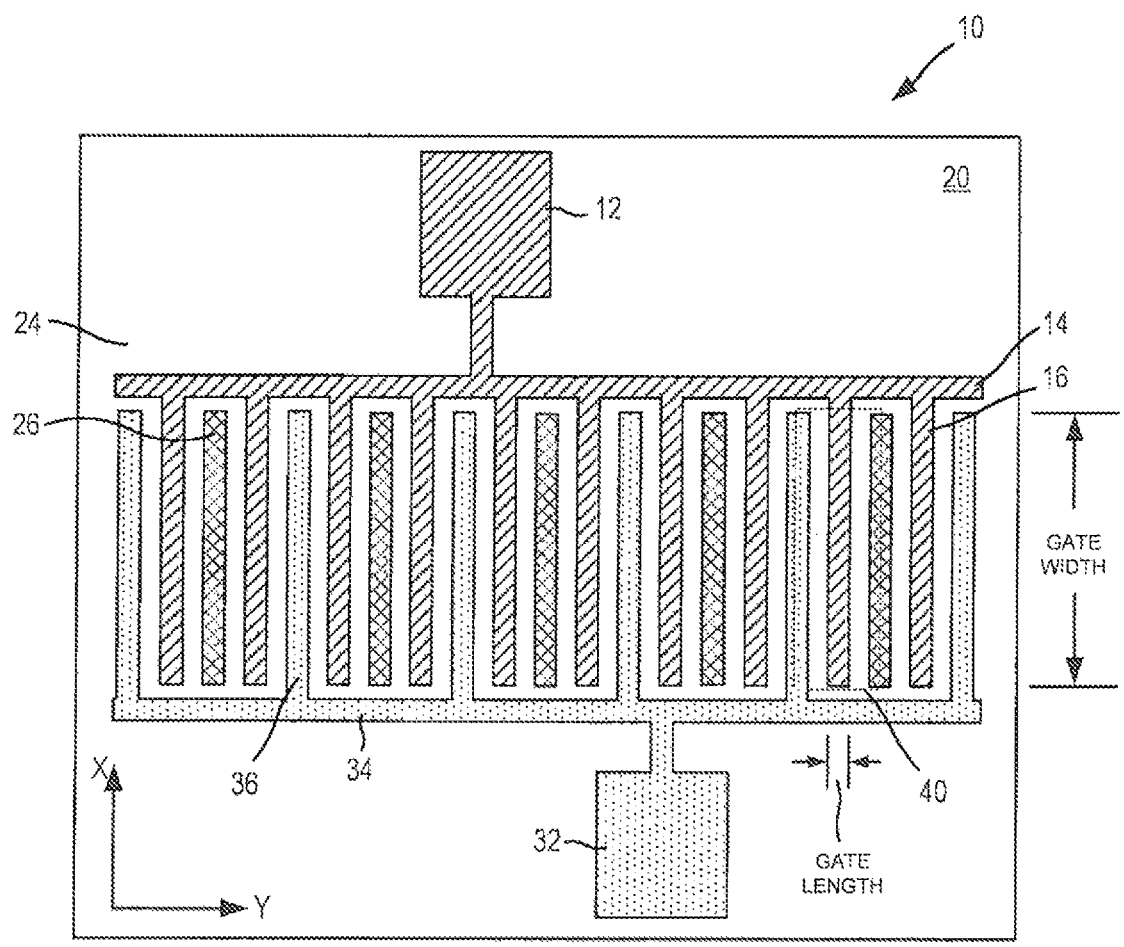
FIG. 1 is a plan view of a metal layout of a conventional multi-cell transistor.

Embodiments of the present inventive concepts are described more fully hereinafter with reference to the accompanying drawings, in which embodiments of the invention are shown. This inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like numbers refer to like elements throughout.

Embodiments of the inventive concepts provide multi-cell transistor devices with large effective gate widths. By feeding the gate signal to the gate fingers at an interior position of the gate interconnect, such as a midpoint of a gate interconnect, large phase differences that can occur due to the gate signal propagating across the full length of a long gate finger may be reduced and/or avoided. According to some embodiments, a larger gate width of a multi-cell transistor device can be accommodated by adding a gate runner above a gate interconnect, with a conductive via coupling the gate runner to an interior position on the gate interconnect. The connection of the gate runner to the interior position of the gate interconnect may serve to divide the gate finger into multiple segments. The gate signal may thus travel from the interior position of the gate interconnect to ends of the gate interconnect, and be provided to the gate finger with little to no phase difference in the resulting propagated gate signal.

By effectively dividing the gate finger into segments and distributing the gate signal to each of the gate finger segments by means of a gate runner, the gain performance of the transistor may be increased as compared to conventional devices.

Thus, in some embodiments, transistors are provided that includes a semiconductor structure, a plurality of gate fingers extending on the semiconductor structure in a first direction, a plurality of gate interconnects that each have a first end and a second end extending on the semiconductor structure in the first direction, a plurality of gate runners extending on the semiconductor structure in the first direction, and a gate manifold on the semiconductor structure and connected to the gate runners. Each gate interconnect is connected to a respective gate finger by a plurality of first conductive vias. The gate interconnects are connected to the respective gate runners by respective second conductive vias at interior positions of the gate interconnects that are remote from the respective first ends and the respective second ends of the gate interconnects. The semiconductor structure may comprise, for example, a semiconductor or non-semiconductor substrate having one or more semiconductor epitaxial layers grown thereon. The substrate may be removed in some embodiments.

In some embodiments, transistors are provided that include a semiconductor structure, a plurality of source regions and a plurality of drain regions alternately arranged on the semiconductor structure, a plurality of gate fingers extending respectively at a first level between adjacent ones of the plurality of source regions and the plurality of drain regions, a plurality of gate interconnects on the semiconductor structure at a second level above the semiconductor structure that is higher than the first level, a plurality of gate runners on the semiconductor structure at a third level above the semiconductor structure that is higher than the second level, and a gate manifold on the semiconductor structure and connected to the gate runners. Each of the gate interconnects is connected to a respective gate finger by a plurality of first conductive vias. Each gate runner is connected to a respective gate interconnect by a second conductive via, the second conductive via connecting to the respective gate interconnect at a respective first interior position on the gate interconnect that overlaps an adjacent source region.

In some embodiments, transistors are provided that include a semiconductor structure, a plurality of gate fingers extending on the semiconductor structure, a plurality of gate interconnects on the semiconductor structure, each of the plurality of gate interconnects electrically coupled to respective ones of gate fingers, where each gate interconnect of the plurality of gate interconnects has a first end and a second end, and a plurality of gate runners on the semiconductor structure. Each gate is connected to at least one gate interconnect by a conductive via. Current received at the first end of the at least one gate interconnect via the conductive via has less than 1 degree phase difference from current received at the second end of the at least one gate interconnect via the conductive via.

Embodiments of the present invention will now be described in greater detail with reference to FIGS. 2A-11.

As discussed in the Background section, one technique for increasing the effective gate periphery of a transistor is to provide a plurality of unit cell transistors that are connected in parallel. Such a plurality of unit cell transistors may be used in applications involving high frequency and/or high power. For example, base stations may use RF power amplifiers in the final stage of signal amplification to generate the high output power required for coverage of the cell. An important element in these RF power amplifiers, as well as similar applications, is the unit cell transistors that produce the amplification mechanism.

Figure 2A:
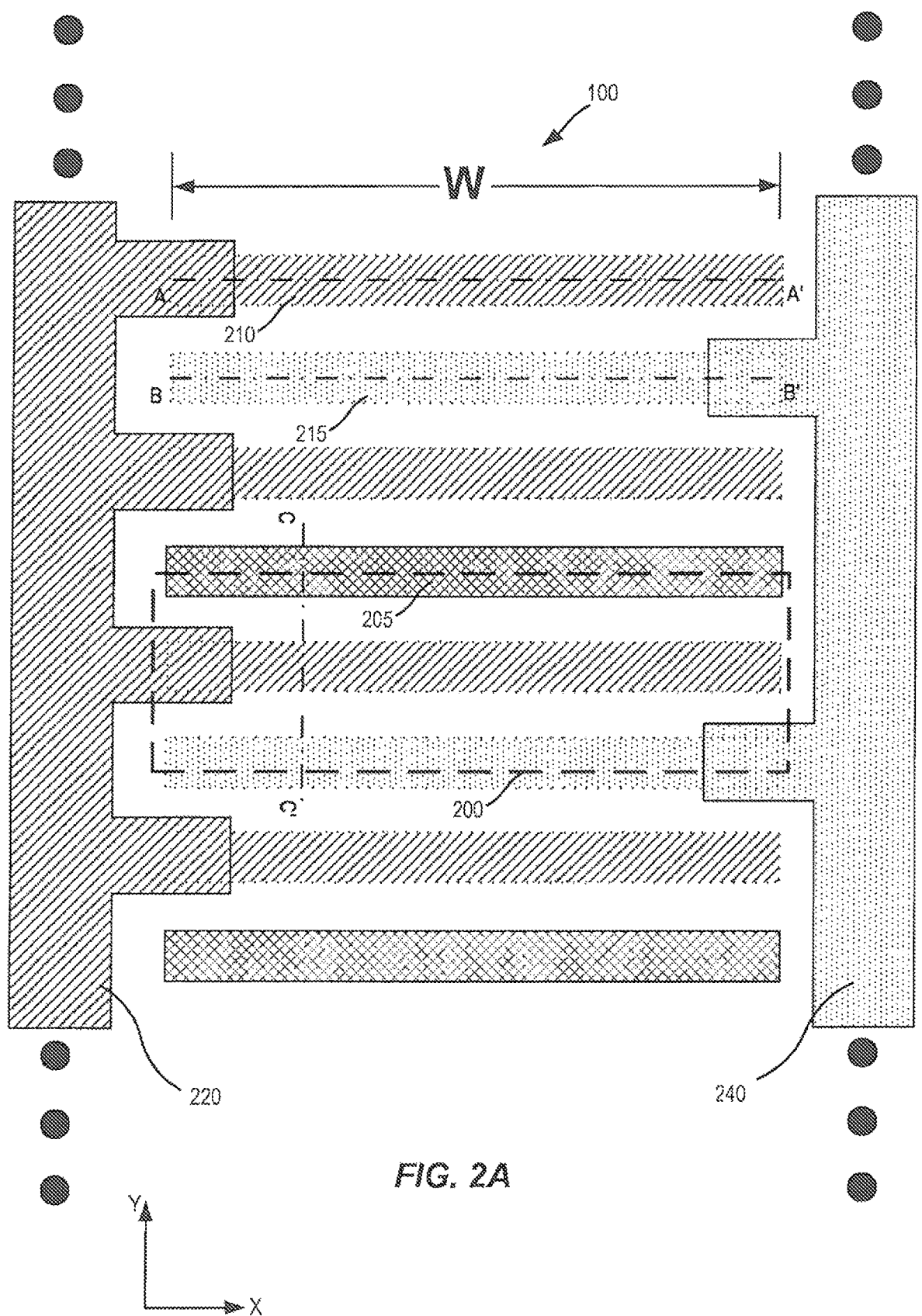
FIG. 2A is a plan view illustrating embodiments of a multi-cell transistor utilizing gate and drain runners.
Figure 2B:
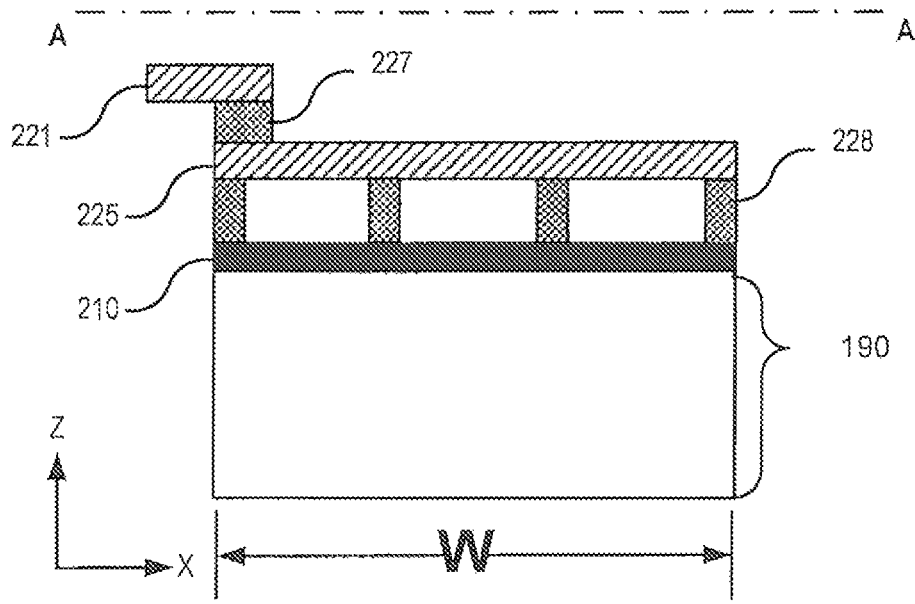
FIG. 2B is a cross section of FIG. 2A taken along the lines A-A'.
Figure 2C:
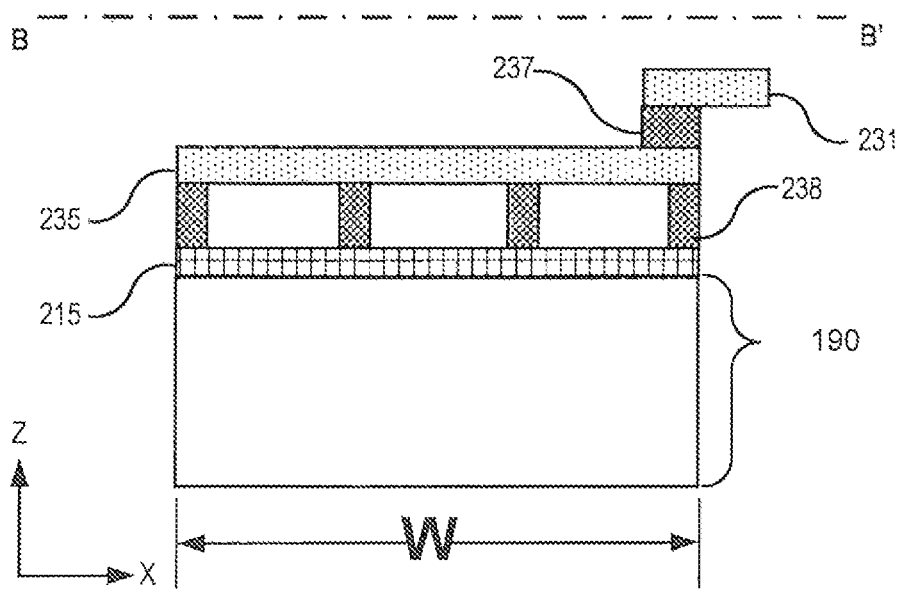
FIG. 2C is a cross section of FIG. 2A taken along the lines B-B'.

FIG. 2A is a plan view illustrating embodiments of a multi-cell transistor utilizing gate and drain runners. FIG. 2B is a cross section of FIG. 2A taken along the lines A-A'. FIG. 2C is a cross section of FIG. 2A taken along the lines B-B'.

Referring first to FIG. 2A, a transistor device 100 is illustrated that includes a plurality of transistor cells 200. The active region of a transistor cell 200 may include a gate finger 210, a drain finger 215, and a source contact 205. During amplification, current flows between the drain finger 215 and the source contact 205, and the amount of current may be modulated by a voltage signal applied to the gate finger 210.

As illustrated in FIG. 2B, a gate signal may be provided to the transistor cell 200 via a gate finger 210. The gate finger 210 may be electrically coupled to gate regions of a transistor cell 200. Similarly, as illustrated in FIG. 2C, a drain signal may be provided to the transistor cell 200 via a drain finger 215.

The gate finger 210, a drain finger 215, and a source 205 may be formed on a semiconductor structure 190 which contains an embodiment of a transistor. More specifically, the drain finger 215, the source contact 205, and the gate finger 210, may be respectively coupled to a drain region, a source region, and a gate region (e.g., a channel) of a semiconductor implementation of a transistor cell 200. It will be understood that multiple embodiments of a semiconductor-based transistor cell 200 are possible to which the drain finger 215, the source contact 205, and the gate finger 210 of FIG. 2A may be connected. For example, the drain finger 215, the source contact 205, and the gate finger 210 may be coupled to LDMOS and/or HEMT transistor embodiments, though the present invention is not limited thereto.

Figure 3A:
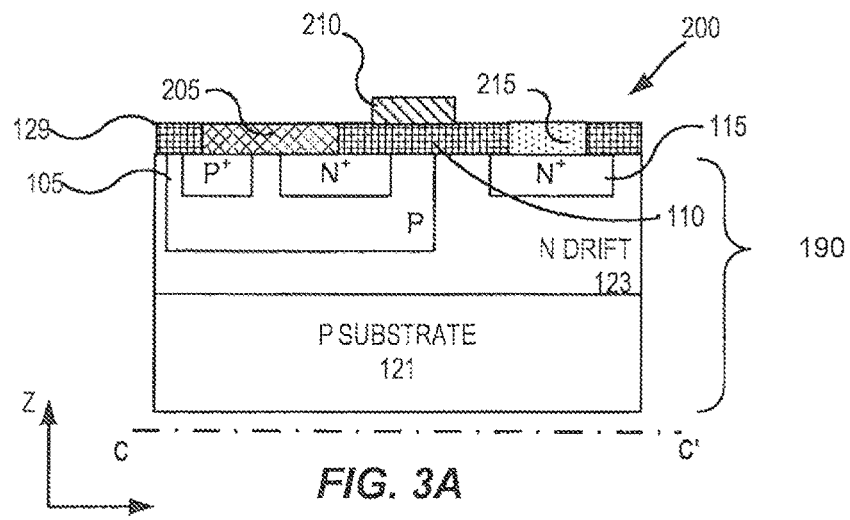
FIG. 3A is a cross section of a unit cell of a conventional laterally diffused metal oxide semiconductor (LDMOS) transistor device.

For example, FIG. 3A, which is a cross section of FIG. 2A taken along the line C-C', illustrates an implementation of the transistor cell 200 of FIG. 2A where the transistor cell is an LDMOS transistor cell. An LDMOS field effect transistor (FET) is a 3-terminal transistor device that has a source region 105 and a drain region 115 that are formed in a semiconductor structure 190. The semiconductor structure 190 includes a semiconductor substrate 121 (e.g., of p-type conductivity) and a drift layer 123 (e.g., of n-type conductivity) on the semiconductor substrate 121. The semiconductor substrate may include semiconductor and non-semiconductor substrates, including, for example, sapphire, diamond, aluminum nitride, aluminum gallium nitride, gallium nitride, silicon, silicon carbide, GaAs, LGO, ZnO, LAO, InP and the like. The LDMOS transistor cell 200 may include doped well regions providing the source region 105 and drain region 115. The source region 105, drain region 115, and gate region 110 of the LDMOS transistor cell 200 may be coupled to contacts for operation of the LDMOS transistor cell 200. For example, the gate region 110 may be electrically coupled to the gate fingers 210 that are illustrated in FIG. 2A. Similarly, drain region 115 may be electrically coupled to the drain fingers 215 illustrated in FIG. 2A.

The gate region 110 is isolated from the conducting channel by an insulator layer 129 (e.g., SiO$_2$). Applying a positive voltage to the gate region 110 with respect to the source region 105 may provide for a current to flow between drain region 115 and the source region 105 by forming an inversion layer (e.g., a channel) between the source region 105 and the drain region 115. LDMOS FETs may operate in "enhancement mode," meaning the drain-source current may not flow until an applied positive gate voltage enhances a channel across the p-well.

Figure 3B:
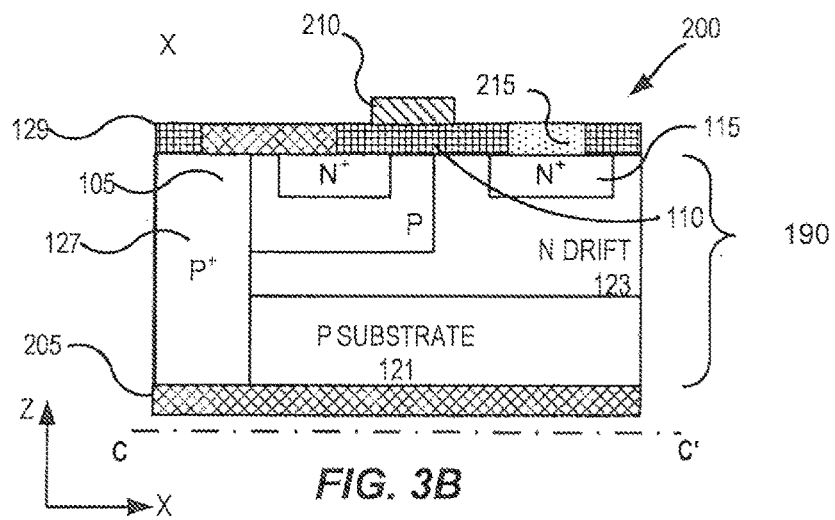
FIG. 3B is a cross section of a unit cell of a conventional LDMOS transistor device utilizing a bottom source terminal.

Though FIG. 3A illustrates the LDMOS with a contact connected to an upper surface of the source region 105 of the LDMOS transistor cell 200, it will be understood that other embodiments are possible. For example, in some embodiments, vias or other connection regions may be provided to connect the source region 105 to a contact on the bottom surface of the LDMOS device. For example, FIG. 3B is a cross section of a conventional LDMOS transistor cell 200 utilizing a bottom source contact 205. As illustrated in FIG. 3B, a laterally diffused, low-resistance p+"sinker" 127 may connect the source region 105 to the substrate 121 and the source contact 205. When the LDMOS device of FIG. 3B is used in conjunction with a parallel transistor configuration such as that illustrated in FIG. 2A, source fingers and/or other source contacts may not be necessary on a top surface of the device. In some embodiments, source fingers similar to the gate fingers 210 and/or drain fingers 215 may be provided.

Figure 3C:
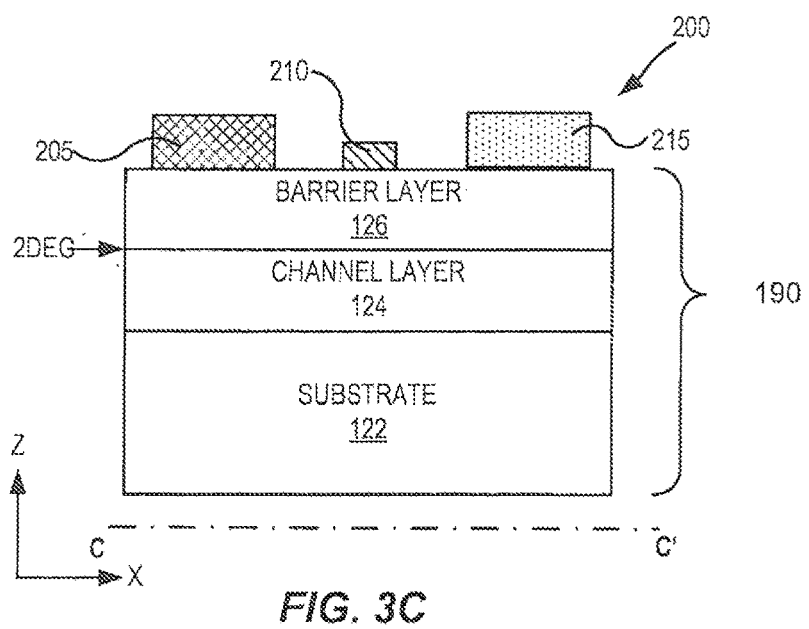
FIG. 3C is a cross section of a conventional high-electron-mobility transistor (HEMT) cell.

FIG. 3C, which is a cross section of FIG. 2A taken along the line C-C', illustrates an implementation of the transistor cell 200 of FIG. 2A where the transistor cell 200 is a HEMT transistor cell. As illustrated in FIG. 3C, a HEMT transistor cell 200 may include a semiconductor structure 190 including a substrate 122, which may, for example, include 4H—SiC or 6H—SiC. Although silicon carbide may be used as a substrate material, embodiments of the present invention may utilize any suitable substrate, such as sapphire, diamond, aluminum nitride, aluminum gallium nitride, gallium nitride, silicon, GaAs, LGO, ZnO, LAO, InP and the like. An epitaxial structure is formed on the substrate 122. The epitaxial structure may include a channel layer 124 that is formed on the substrate 122, and a barrier layer 126 that is formed on the channel layer 124. The channel layer 124 and the barrier layer 126 may include Group III-nitride based materials, with the material of the barrier layer 126 having a higher bandgap than the material of the channel layer 124. For example, the channel layer 124 may comprise GaN, while the barrier layer 126 may comprise AlGaN. While the channel layer 124 and the barrier layer 126 are illustrated as single layer structures, it will be appreciated that either or both the channel layer 124 and/or the barrier layer 126 may be implemented as multi-layer structures. It will also be appreciated that additional layers such as, for example, buffer layers, strain-balancing layers, transition layers and the like may also be included as part of the epitaxial structure provided on the substrate 122.

Due to the difference in bandgap between the barrier layer 126 and the channel layer 124 and piezoelectric effects at the interface between the barrier layer 126 and the channel layer 124, a two dimensional electron gas (2DEG) is induced in the channel layer 124 at a junction between the channel layer 124 and the barrier layer 126. The 2DEG acts as a highly conductive layer that allows conduction between the source and drain regions of the device that are beneath a source contact segment 205 and a drain finger 215, respectively. The source contact segment 205 and the drain finger 215 are formed on the barrier layer 126. A gate finger 210 is formed on the barrier layer 126 between the drain finger 215 and the source contact segment 205.

The LDMOS and HEMT devices of FIGS. 3A, 3B, and 3C are included as examples for possible configurations of a transistor cell 200. However, it will be understood that other transistor cell configurations could be utilized with the present invention without deviating from the scope of the embodiments described herein. For example, any configuration of a transistor cell 200 that may be combined with other transistor cells using a gate finger and/or drain finger may benefit from the embodiments described herein. As such, the present invention is not limited to HEMT and LDMOS transistor cells. As used herein, the term "semiconductor structure" will be used to refer to the transistor cell configurations to which the gate fingers 210 and drain fingers 215 of FIG. 2A may be connected (such as, for example, the LDMOS and HEMT examples illustrated in FIGS. 3A, 3B, and 3C).

Referring back to FIGS. 2A, 2B, and 2C, the gate finger 210 may be coupled to a gate runner 225 by a plurality of first conductive gate vias 228. In some embodiments, the gate runner 225 may be at a higher level above the semiconductor substrate than the gate finger 210. The gate runner 225 may be further connected to a gate pad 221 by a second conductive gate via 227. The gate pad 221 may be further connected to a gate manifold 220. The gate manifold 220 may provide the gate signal to a plurality of the transistor cells 200.

The drain finger 215 may be coupled to a drain runner 235 by a plurality of first conductive drain vias 238. In some embodiments, drain runner 235 may be at a higher level above the semiconductor structure 190 than the drain finger 215. The drain runner 235 may be further connected to a drain pad 231 by a second conductive drain via 237. The drain pad 231 may be further connected to a drain manifold 240. The drain manifold 240 may provide the drain signal to the plurality of transistor cells 200.

For a given fixed drain bias voltage provided to the transistor device 100, the amount of output current affects the output power of the transistor device 100. The output current is based, in part, on the total gate periphery, which is the gate finger width (W) shown in FIGS. 2A-2B multiplied by the number of gate fingers 210.

A larger gate periphery may be used to produce higher power in the transistor device 100. This higher power output may be achieved either by increasing the number of gate fingers 210, and/or by increasing the width of the gate fingers 210 (e.g., extending the gate fingers 210 in the X-direction). However, each solution has its limitations.

Figure 4:
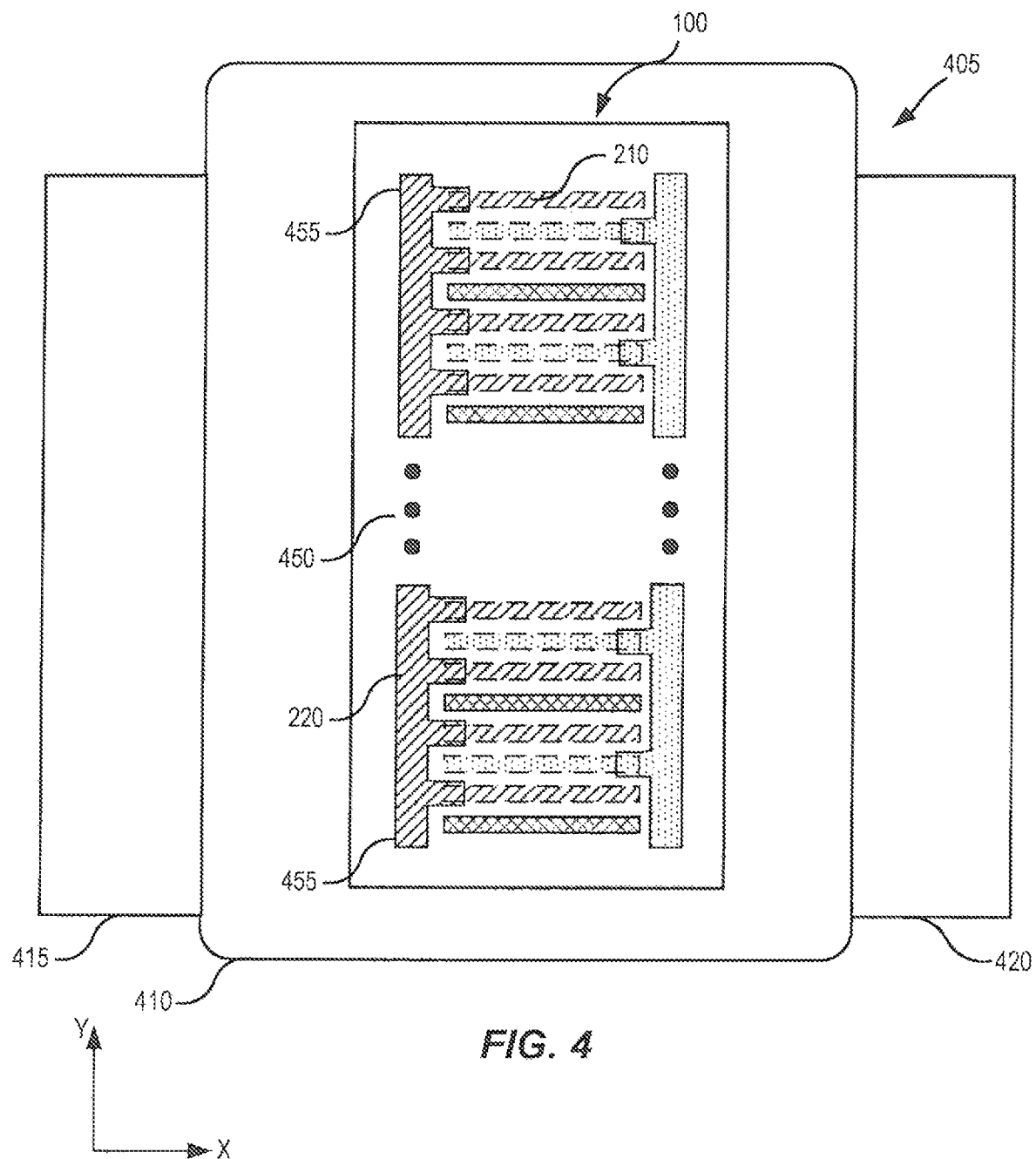
FIG. 4 is a plan view illustrating a transistor device in which a number of gate fingers is increased.

For example, increasing the number of gate fingers 210 may increase the final transistor die physical width (e.g., in the Y-direction in FIG. 2A). The physical transistor package and/or semiconductor processing equipment may therefore put a constraint on the maximum number of gate fingers 210 that may be included in the device (or alternatively, a maximum extent to which the device may extend in the Y-direction). This can be seen with reference to FIG. 4 which is a plan view of a transistor device 100 having a large number of gate fingers 210. As can be seen in FIG. 4, the size of the physical transistor package 405 may be limited by a size of a base 410 upon which the transistor device 100 is placed. The physical transistor package 405 may also be affected by the size of the package leads, such as a gate lead 415 and/or a drain lead 420.

As also illustrated in FIG. 4, another potential downside of using an increased number of gate fingers 210 in a transistor device 100 is the non-uniform signal phase distribution that may occur along the length of the gate manifold 220. The magnitude of the impact that increasing the number of gate fingers may have on the signal phase distribution and device performance may depend on the design of the transistor device. A given transistor device 100 may have a central portion 450 and end portions 455. As the length of the gate manifold 220 becomes longer, a phase difference may occur in signals, such as, for example, the gate signal transmitted to gate fingers 210, that are transmitted along the length of the gate manifold 220 (e.g., in the Y-direction). In some embodiments, the gate signal may be received from the gate lead 415 primarily at the central portion 450 of the gate manifold 220, to be distributed to the end portions 455 of the gate manifold 220. Because of differences in transmission lengths, a phase of a gate signal at an end portion 455 may differ from a phase at a central portion 450. The drain current produced at these different regions may also therefore not be summed in phase at the output (e.g., at drain lead 420), causing a degradation in the total output current magnitude and consequently, in the output power of the transistor device 100.

Figure 5A:
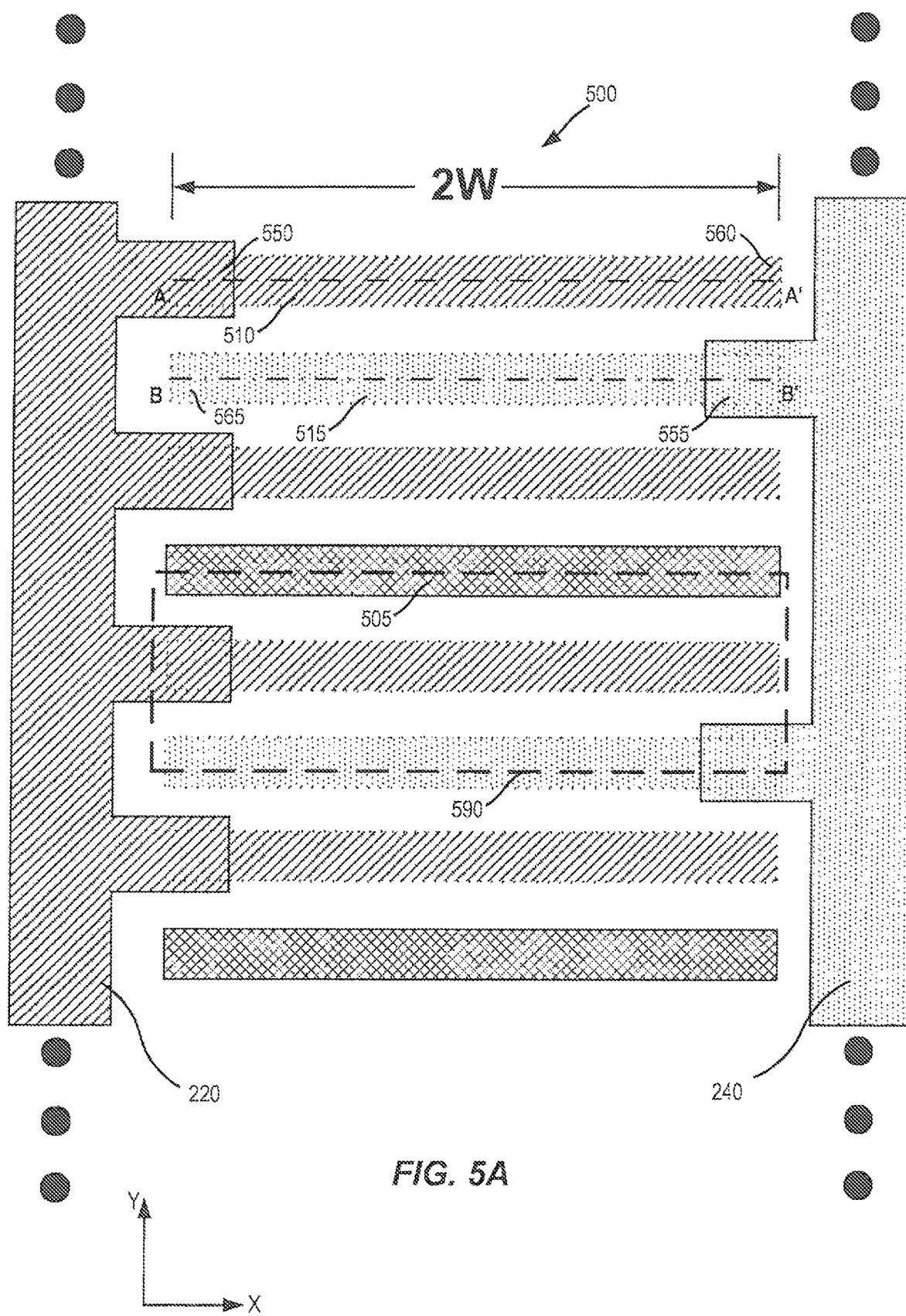
FIG. 5A is a plan view illustrating a transistor device in which a width of gate fingers is increased.
Figure 5B:
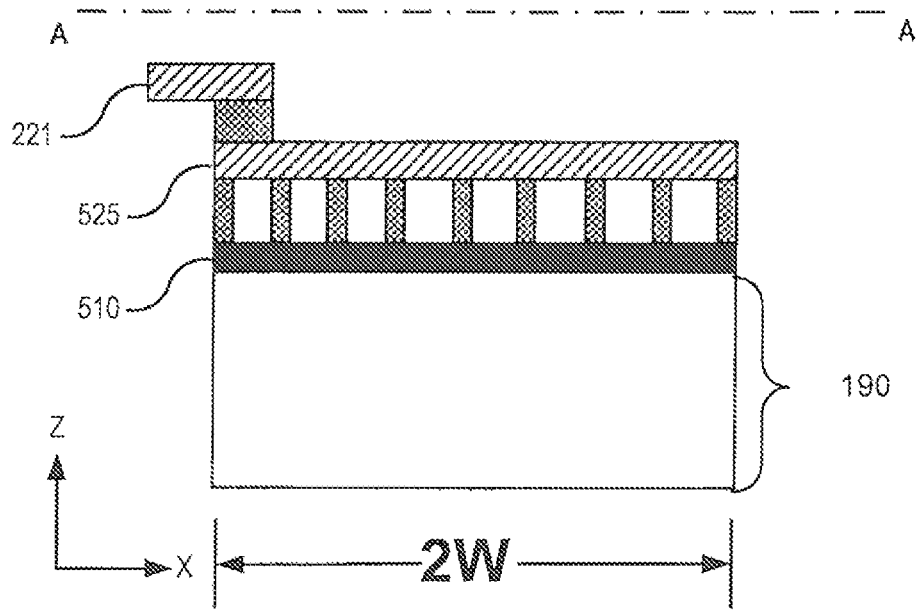
FIG. 5B is a cross section of FIG. 5A taken along the lines A-A'.
Figure 5C:
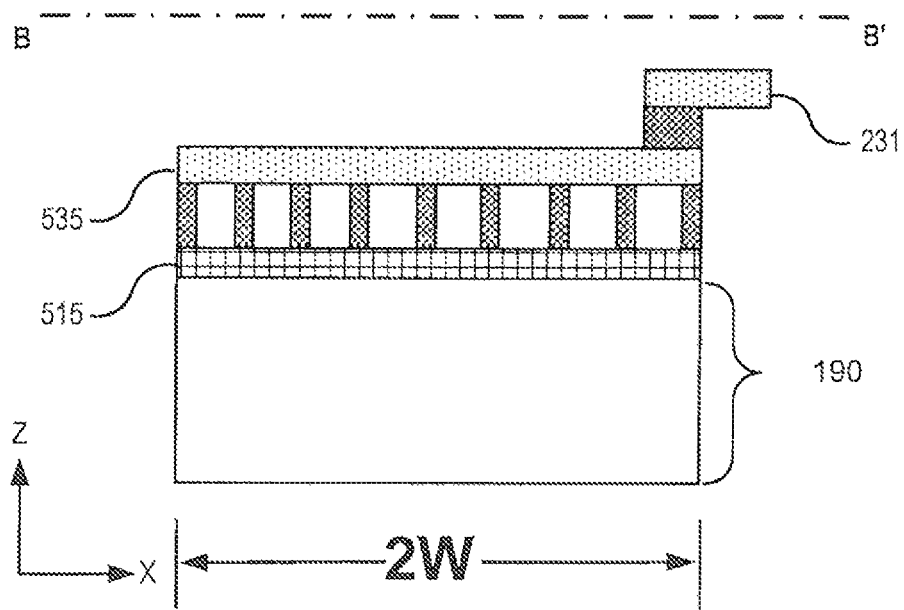
FIG. 5C is a cross section of FIG. 5A taken along the lines B-B'.

In addition to increasing the number of gate fingers within the transistor device 100, another technique to increase the transistor output power may include increasing the gate finger width (W), along with corresponding increases in the widths of the source contacts and the drain fingers. FIG. 5A is a plan view illustrating an embodiment of a transistor device 500 in which the widths of the gate fingers 510, the source contacts 505 and the drain fingers 515 are increased. FIG. 5B is a cross section of FIG. 5A taken along the lines A-A'. FIG. 5C is a cross section of FIG. 5A taken along the lines B-B'.

The transistor device 500 of FIGS. 5A-5C may closely resemble the transistor device of FIGS. 2A-2C. However, the width of the gate fingers 510, the source contacts 505 and the drain fingers 515 included in the transistor device 500 is increased as compared to the widths of the corresponding gate fingers 210, source contacts 205 and drain fingers 215 of the transistor device 100. For example, a width of the gate fingers 510 of the transistor device 500 may be 2W (e.g., twice as wide as the gate width of the gate fingers 210 of transistor device 100). The gate fingers 510, source contacts, and drain fingers 515 with the increased width may be connected to the semiconductor structure 190 to form a transistor cell 590. The widened gate fingers 510 may include gate pads 221 and gate runners 525, with structure similar to that discussed herein with respect to the gate pads 221 and gate runners 225 of FIG. 2B. The widened drain fingers 515 may include drain pads 231 and drain runners 535, with structure similar to that discussed herein with respect to the drain pads 231 and drain runners 235 of FIG. 2C. Other aspects of the transistor device 500 may be similar to the transistor device 100 discussed above with respect to FIGS. 2A-2C. In addition, it will be appreciated that the transistor device 500 may include the semiconductor structure 190 that is may be configured as, for example, a HEMT or as other types of transistors such as, for example, LDMOS transistors in the same manner as the transistor device 100 as discussed above with reference to FIGS. 3A-3C.

Unfortunately, increasing the width of the gate fingers 510 may introduce performance issues. The first issue is an increase in gate resistance. (See, e.g., P. H. Aaen, J. A. Pla, J. Wood, "Modeling and Characterization of RF and Microwave Power FETs," Cambridge University Press, 2007). If the number of gate fingers 510 is held constant and the length of the gate fingers 510 is changed, the gate resistance $R_{new}$ for the new configuration of gate fingers 510 is given by:

$$R_{new} = R_{orig}\left(\frac{W_{new}}{W_{orig}}\right) \qquad \text{[Equation 1]}$$

where $R_{orig}$ and $W_{orig}$ are the gate resistance and gate finger width, respectively, for the original gate finger configuration (e.g., gate finger 210 of FIG. 2A), and $W_{new}$ is the width of a gate finger in the new configuration (e.g., gate finger 510 of FIG. 5A). As can be seen from Equation 1, increasing the gate finger width from W to 2W doubles the gate resistance. Increasing the gate resistance may result in a lower transistor gain, an important specification for an amplifier. For example, if a transistor with a gate finger length of W produces an output power of P, doubling the width of the gate fingers 510 to 2W produces an output power that is lower than 2P. This non-linear scaling also poses a challenge for power amplifier designers in selecting the correct transistor die size for a given output power requirement. The increased resistance also reduces the efficiency of the amplifier.

Another drawback associated with gate fingers 510 and/or drain fingers 515 having large widths is the increase in a phase difference that occurs in the signal along the length of the finger (e.g., from region 550 to region 560 of the gate finger 510 and/or from region 555 to region 565 of the drain finger 515). This phase difference may be caused by various distributed effects related to the transmission distance along the gate finger 510 and/or the drain finger 515. These phase differences can degrade the total output current magnitude after being summed up (combined) at the drain manifold 240. The end result may be a lower output power for the transistor device 500 than expected from the increased dimensions. Since the input power is the same, this may also contribute to the gain degradation phenomenon.

Additionally, the out-of-phase current combining may affect the time-domain output current waveform shape, and may impact the transistor efficiency, which is another key specification for a power amplifier. (See, e.g., S. C. Cripps, "RF Power Amplifiers for Wireless Communications," Artech House, 2006.) The non-uniform phase phenomenon may also be present in the original shorter gate fingers 210 of FIGS. 2A-2C, but to a smaller degree.

Figure 6A:
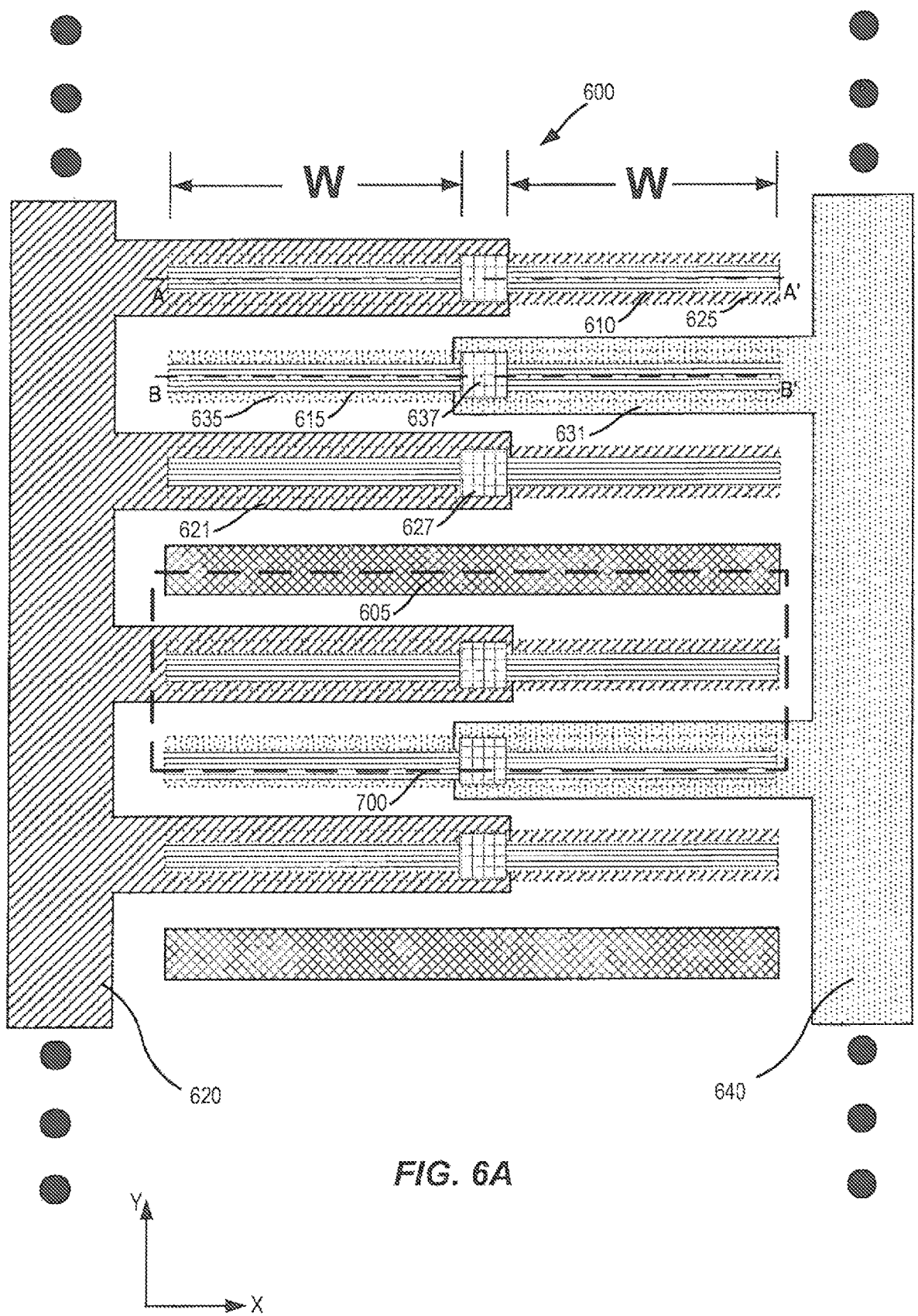
FIG. 6A is a plan view illustrating a transistor device in which a width of gate fingers is increased, according to some embodiments of the invention.
Figure 6B:
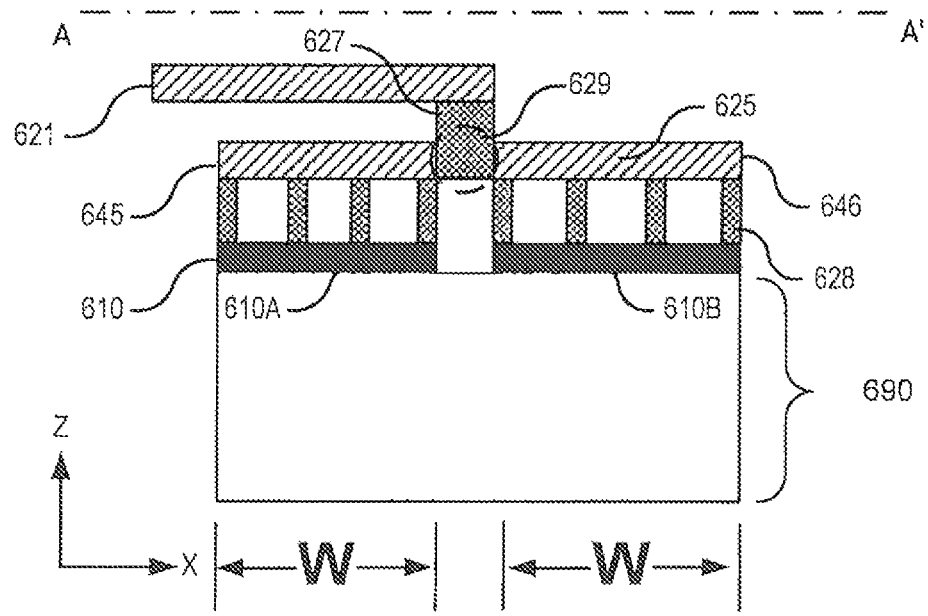
FIG. 6B is a cross section of FIG. 6A taken along the lines A-A', according to some embodiments of the invention.
Figure 6C:
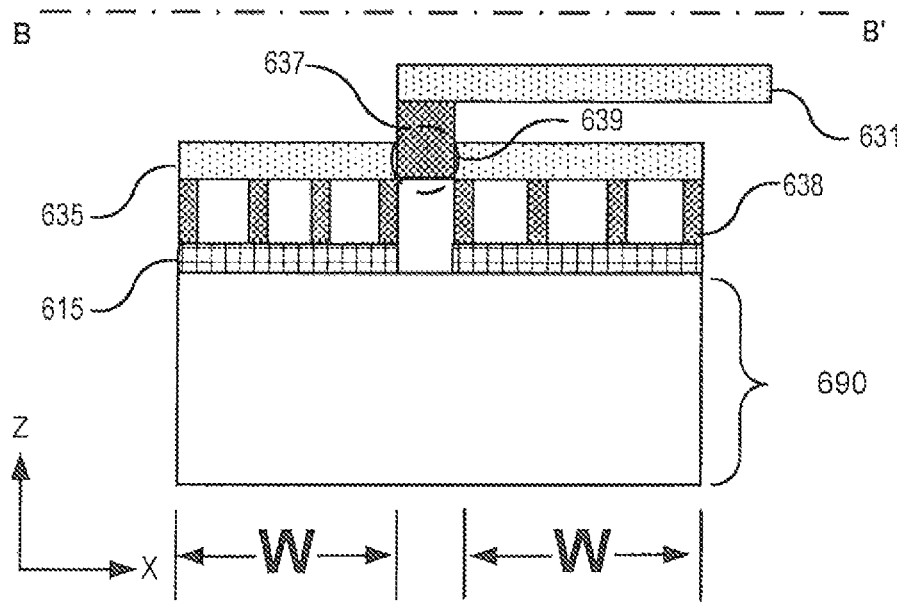
FIG. 6C is a cross section of FIG. 6A taken along the lines B-B', according to some embodiments of the invention.

To mitigate these issues when higher output power is required, a solution is proposed as shown in FIGS. 6A, 6B, and 6C. FIG. 6A is a plan view illustrating a transistor device 600 in which the width of gate fingers 610 are increased, according to some embodiments of the invention. FIG. 6B is a cross section of FIG. 6A taken along the lines A-A', according to some embodiments of the invention. FIG. 6C is a cross section of FIG. 6A taken along the lines B-B', according to some embodiments of the invention.

As illustrated in FIGS. 6A, 6B, and 6C some embodiments of the present invention may provide a plurality of transistor cells 700 repeatedly arranged on a semiconductor structure 690. It will be appreciated that the transistor cells 700 may be formed of semiconductor structures 690 such as those illustrated in FIGS. 3A-3C (e.g., LDMOS or HEMT transistor cells). The transistors cells 700 may be arranged as part of a transistor device 600 to provide a combined output signal. For example, the respective gate regions, drain regions, and source regions of the plurality of transistor cells 700 may be commonly connected so as to provide a plurality of transistors coupled in parallel.

The transistor cells 700 may be repeatedly arranged in a first direction (e.g., a Y-direction). The gate region, the drain region, and the source region of a respective transistor cell 700 may extend in a second direction (e.g., an X-direction) that crosses the first direction. The active region for each of the transistor cells 700 may include the region of the semiconductor structure 690 in which a respective gate region, drain region, and source region overlap in the first direction (e.g., the X-direction). In some embodiments, the source region of adjacent transistor cells 700 may be a shared source region that acts as a source region for two different gate regions. Similarly, in some embodiments, the drain region of adjacent transistor cells 700 may be a shared drain region that acts as a drain region for two different gate regions.

The transistor device 600 may also include a plurality of gate fingers 610 that are spaced apart from each other along on the semiconductor structure 690 in the first direction (e.g., the Y-direction). Each of the gate fingers 610 may have a width 2W in the second direction (e.g., the X-direction) or some other width that exceeds the width of a conventional transistor device. In some embodiments the width 2W may be 800 microns.

The gate fingers 610 may be disposed on the semiconductor structure 690 to be respectfully in electrical contact with the gate regions (e.g., a channel) of the plurality of transistor cells 700. The plurality of gate fingers 610 may provide a gate signal to respective ones of the transistor cells 700.

In some embodiments, the transistor device 600 may also include a plurality of drain fingers 615 that are arranged on the semiconductor structure 690 in the first direction (e.g., the Y-direction). Each of the plurality of drain fingers 615 may have a width 2W in the second direction (e.g., the X-direction), though the present invention is not limited thereto. The plurality of drain fingers 615 may be disposed on the semiconductor structure 690 to be respectfully in electrical contact with the drain regions of the plurality of transistor cells 700. The drain fingers 615 may conduct a drain signal of respective ones of the transistor cells 700.

In some embodiments, the transistor device 600 may also electrically connect each of the source regions of respective ones of the transistor cells 700 to a common source signal. In some embodiments, the electrical connection for the source regions may be on a back side of the semiconductor structure 690 (e.g., a side of the semiconductor structure 690 that is opposite the gate fingers 610 and the drain fingers 615. In some embodiments, a plurality of source fingers may also be provided on the same side of the semiconductor structure 690 as the gate fingers 610 and the drain fingers 615. The plurality of source fingers may have a structure similar to that discussed herein with respect to the gate fingers 610 and drain fingers 615.

Each gate finger 610 may be coupled to a gate interconnect 625 by a plurality of first conductive gate vias 628. In some embodiments, the gate interconnects 625 may be at a higher level above the semiconductor structure 690) than the gate fingers 610. In some embodiments, the gate interconnect 625 may have a greater dimension in the first direction (e.g., in the Y-direction) than the gate finger 610. The gate interconnects 625 may be connected to a gate runner 621 by a second conductive gate via 627. In some embodiments, the gate runner 621 may have a greater dimension in the first direction (e.g., in the Y-direction) than the gate interconnects 625. In some embodiments, the gate runner 621 may contain metal or other highly conductive material, including, for example, copper, gold, and/or a composite metal. The gate runner 621 may be further connected to a gate manifold 620. The gate manifold 620 may provide the gate signal to the plurality of transistor cells 700.

In some embodiments, each second conductive gate via 627 that connects a gate runner 621 to a respective gate interconnect 625 may be connected to the gate interconnect 625 at an interior position 629 of the gate interconnect 625. For example, the gate interconnect 625 may have a first and second opposed ends 645, 646. In some embodiments, the second conductive gate via 627 may be connected to the gate interconnect 625 at an interior position 629 of the gate interconnect 625 that is between the first end 645 and the second end 646. In some embodiments, the interior position 629 may be at a midpoint of (e.g., halfway between) the first end 645 and the second end 646 of the gate interconnect 625. In some embodiments, the interior position 629 may be at a distance that is within ten percent of the length of the gate interconnect 625 from the midpoint of the gate interconnect 625. In some embodiments, the interior position 629 may be at a distance that is within twenty percent of the length of the gate interconnect 625 from the midpoint of the gate interconnect 625. In some embodiments, the interior position 629 may be at a distance that is between one-third and two-thirds of the distance between the first end 645 and the second end 646 of the gate interconnect 625.

Figure 7:
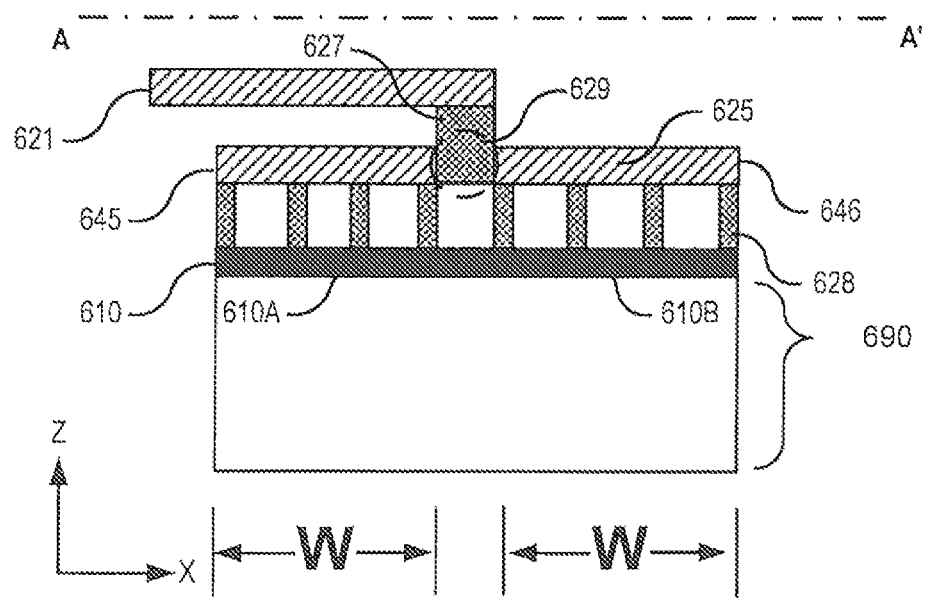
FIGS. 7 and 8 illustrate additional embodiments of the invention, taken along the lines A-A' of FIG. 6A.

In some embodiments, each of the gate fingers 610 may be composed of a first segment 610A and a second segment 610B. In some embodiments, the first segment 610A and the second segment 610B may extend collinearly. In some embodiments, the first segment 610A and the second segment 610B may be arranged at opposite sides of the second conductive gate via 627. For example, for a gate finger 610 that has a width 2W, both the first segment 610A and the second segment 6101 may have a width W, though the present invention is not limited thereto. In some embodiments, the first segment 610A and the second segment 610B may be physically separated by a gap, as illustrated in FIG. 6B. For example, there may be an additional element (e.g., an insulation layer) disposed between the first segment 610A and the second segment 610B. However, the present invention is not limited thereto, and it will be appreciated that in other embodiments the gate finger 610 may not be divided into separate first and second segments 610A, 610B. For example, FIG. 7 illustrates an embodiment in which the first segment 610A and second segment 610B are integrally connected.

Figure 8:
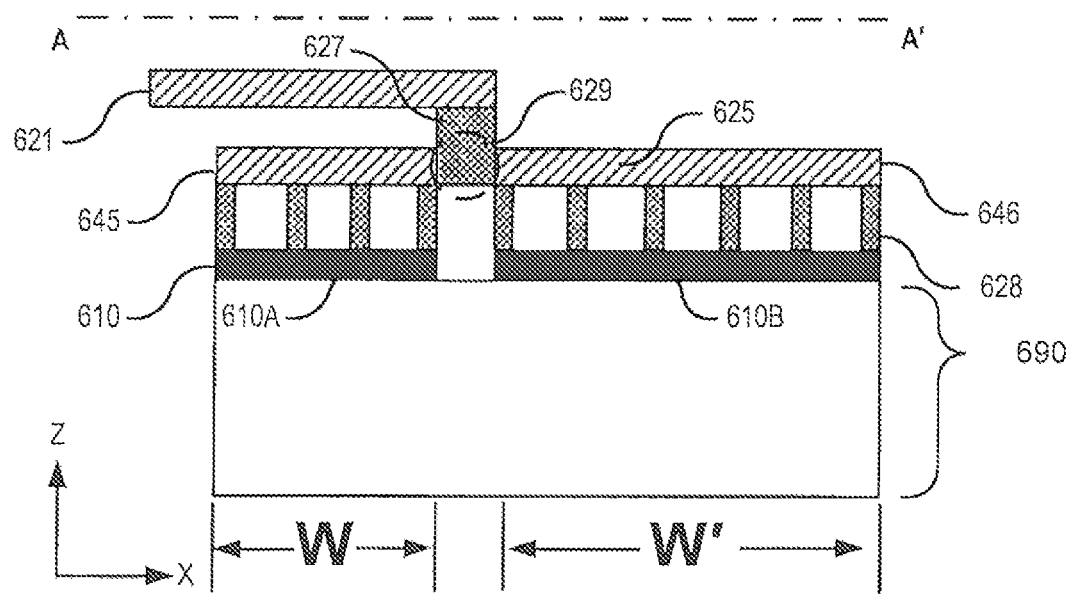

As noted above, in some embodiments, the second conductive gate via 627 may be located at an interior position 629 that is located at the midpoint of the gate interconnect 625. However, in some embodiments, the second conductive gate via 627 may be located at an interior position 629 that is offset from the midpoint of the gate interconnect 625. In such embodiments, the first segment 610A may have a different length than the second segment 610B (or vice versa). For example, as illustrated in FIG. 8, the first segment 610A may have a first length W, and the second segment 610B may have a second length W', different from the first length W.

Each drain finger 615 may be coupled to a respective drain interconnect 635 by a plurality of first conductive drain vias 638. In some embodiments, the drain interconnects 635 may be at a higher level above the semiconductor structure 690 than the drain fingers 615. In some embodiments, the drain interconnects 635 may be at a same level above the semiconductor structure 690 as the gate interconnects 625. In some embodiments, the drain interconnects 635 may be at a different level above the semiconductor structure 690 as the gate interconnects 625. In some embodiments, the drain interconnects 635 may have a greater dimension in the first direction (e.g., in the Y-direction) than the drain fingers 615.

Each drain interconnect 635 may be connected to a respective drain runner 631 by a respective second conductive drain via 637. In some embodiments, the drain runner 631 may be at a higher level above the semiconductor structure 690 than the drain interconnect 635. In some embodiments, the drain runner 631 may be at a same level above the semiconductor structure 690 as the gate runner 621. In some embodiments, the drain runner 631 may be at a different level above the semiconductor structure 690 as the gate runner 621. In some embodiments, the drain runners 631 may have a greater dimension in the first direction (e.g., in the Y-direction) than the drain interconnects 635. In some embodiments, the drain runners 631 may contain metal or other highly conductive material, including, for example, copper, gold, and/or a composite metal. The drain runners 631 may be connected to a drain manifold 640. The drain manifold 640 may provide the drain signal to the plurality of transistor cells 700.

As with the gate runners 621, in some embodiments, the second conductive drain vias 637 that connect each drain runner 631 to a respective drain interconnect 635 may be connected to the drain interconnect 635 at an interior position 639 of the drain interconnect 635. The various possibilities for connecting the drain runners 631 to the drain interconnects 635 are similar to those discussed herein with respect to connecting the gate runners 621 to the gate interconnects 625, and duplicate descriptions thereof will be not be repeated for brevity.

The solution described herein may split each gate interconnect 625 into two segments, and the feed from the gate runners 621 to the respective gate interconnects 625 may be provided through a second conductive gate via 627 located at, for example, roughly the center of each gate interconnect 625, providing a symmetric feed to the first segment 610A and the second segment 610B of the gate finger 610. A similar configuration may also be implemented for the drain side (e.g., for drain interconnect 635 and drain runner 631). This approach retains the original short gate and drain finger lengths (e.g., separate segments with individual lengths of W) while achieving the desired higher output power. In some embodiments, the use of the gate runners 621, which may be wider and have a lower resistance than the gate interconnects 625, may not significantly increase the gate resistance, and may advantageously reduce phase differences in the combined signals of the transistor cells 700 that can degrade the output power of the transistor device 600. For example, in embodiments of the present invention, when a signal (e.g., current) is transmitted over the second conductive gate via 627 to a gate interconnect 625, the signal received at the first end 645 of the gate interconnect 625 may have less than 1 degree phase difference from the signal received at the second end 646 of the gate interconnect 625. In some embodiments, the phase difference may be less than 0.5 degrees.

The present invention increases the finger lengths of a transistor device in a parallel configuration instead of in a series configuration, as is used in conventional devices. However, the present invention reaches substantially the same or greater total gate periphery as the conventional devices. The embodiments described herein therefore produce the desired higher output power but retain the original shorter individual gate finger length of the conventional devices.

With this technique, the gate resistance of the gate finger (or the drain resistance of the drain finger) adds in parallel instead of in series, reducing the overall resistance and improving the transistor gain in a high-power configuration.

This technique has a similar effect as doubling the number of gate fingers but does not result in a die dimension that is physically too wide to fit in a package. It also mitigates the phase variation issues associated with wide transistor dies discussed herein with respect to FIG. 4.

This embodiments described herein also reduce the phase variation along the increased gate and drain finger lengths (2W) described with respect to FIGS. 5A-5C, reverting back to the original phase delta of the shorter gate length (W) described with respect to FIGS. 2A-2C, but increasing (e.g., doubling) the output current.

Figure 9:
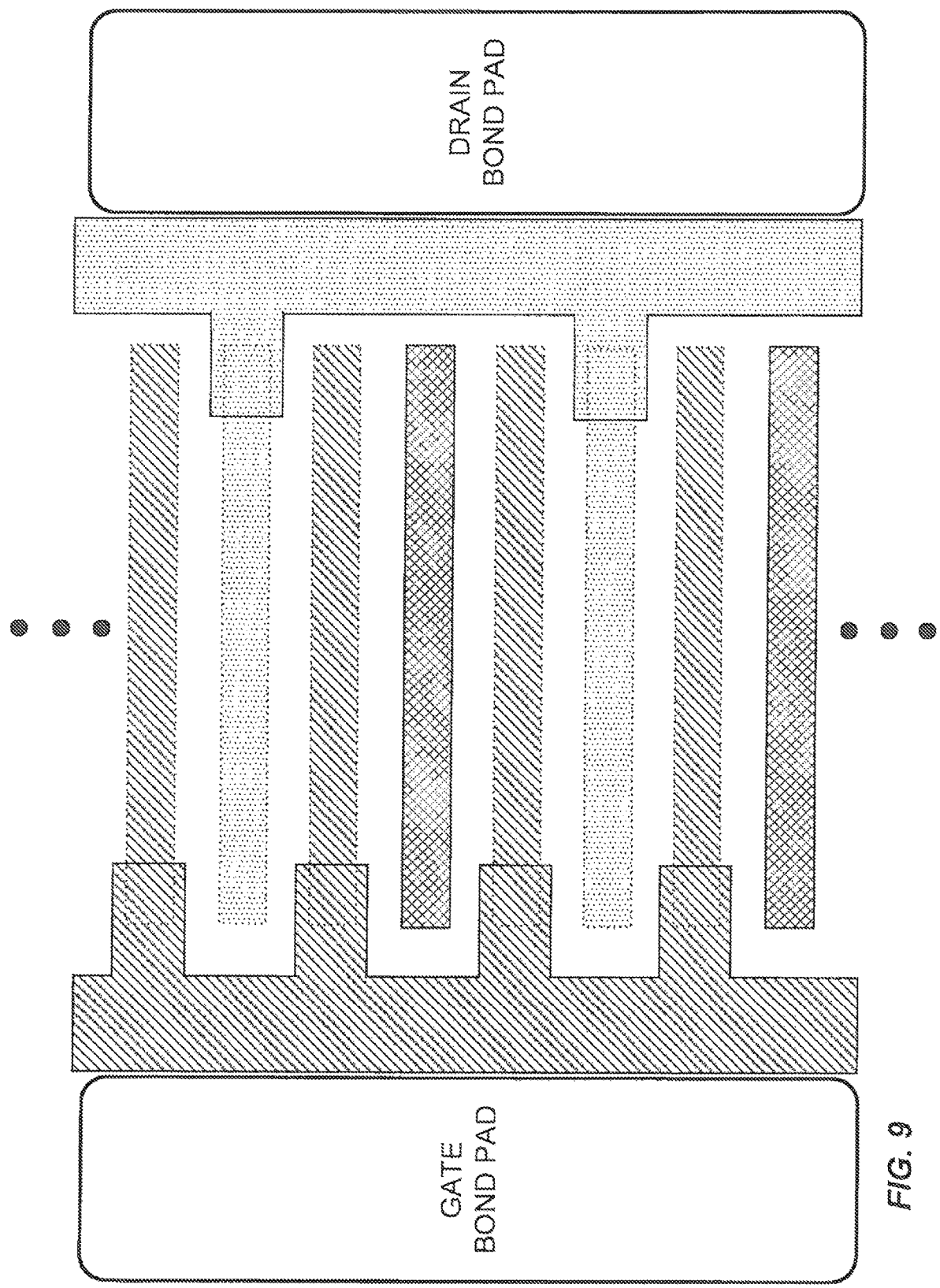
FIGS. 9 and 10 illustrate a comparison of a conventional gate finger configuration with a gate finger configuration according to embodiments of the invention.
Figure 10:
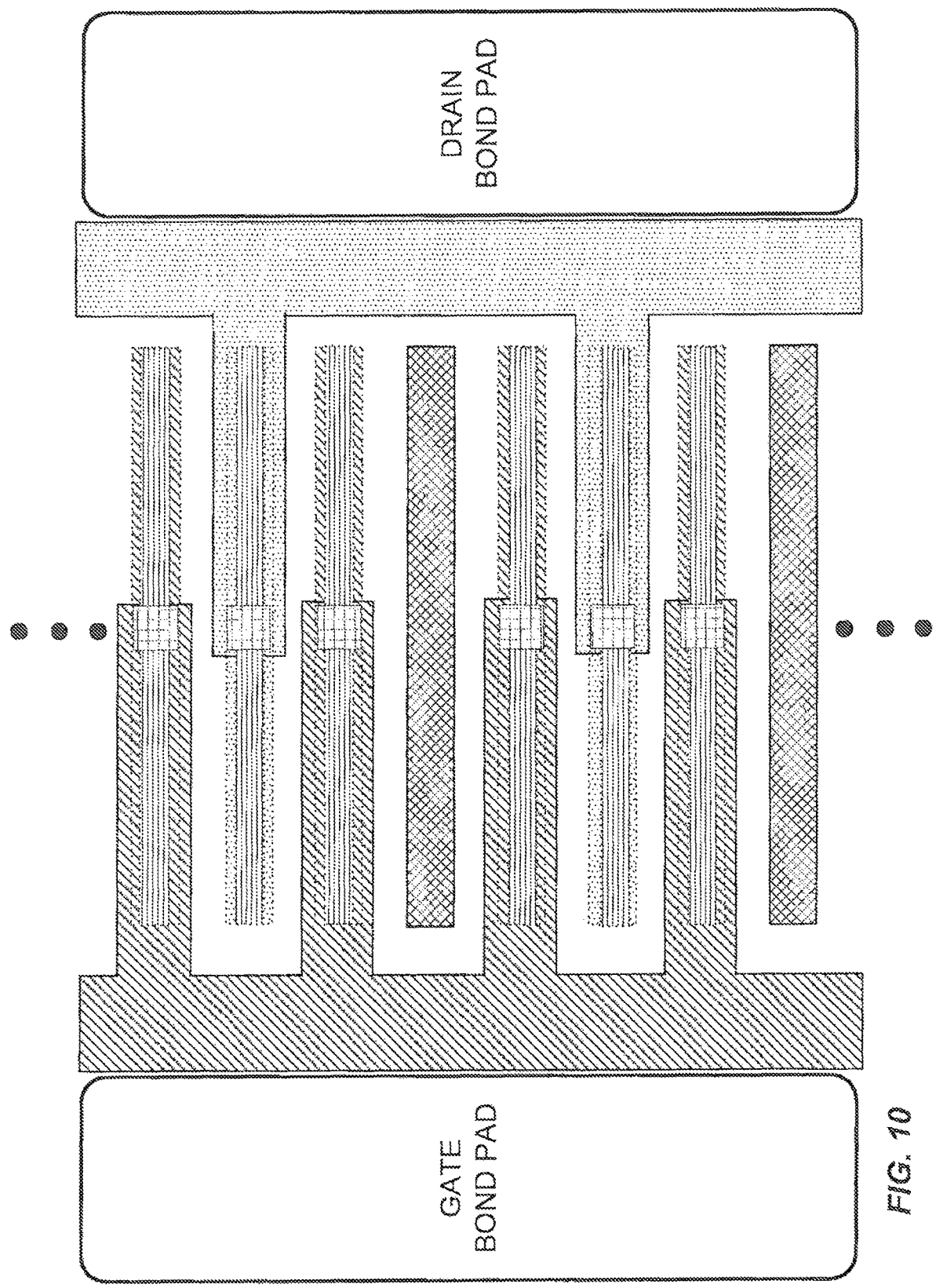

FIGS. 9 and 10 are plan views of a conventional transistor device and a transistor device according to embodiments of the present invention, respectively. The embodiment of the present invention, illustrated in FIG. 10, may be use the same gate and drain bond pad configuration as an existing die, as illustrated in FIG. 9, enabling the standard wire bonding process in manufacturing. For example, as compared to the conventional transistor device having a gate finger width of W, the embodiments of the present invention may maintain the same overall transistor dimension in the first direction (e.g., the Y-direction) while, for example, doubling the gate finger width to 2W in the second direction (e.g., the X-direction). Thus, a transistor device according to the embodiments of the present invention may allow the same or substantially similar manufacturing process to be used as for the conventional transistor device.

As can be seen in FIG. 10, utilizing the gate/drain runner and gate/drain interconnect configuration described herein may improve the performance of the existing device by reducing a phase displacement of the signals propagating through the device. In some embodiments, the improved configuration illustrated in FIG. 10 may be integrated with an existing die while minimizing modifications to the manufacturing process.

Figure 11:
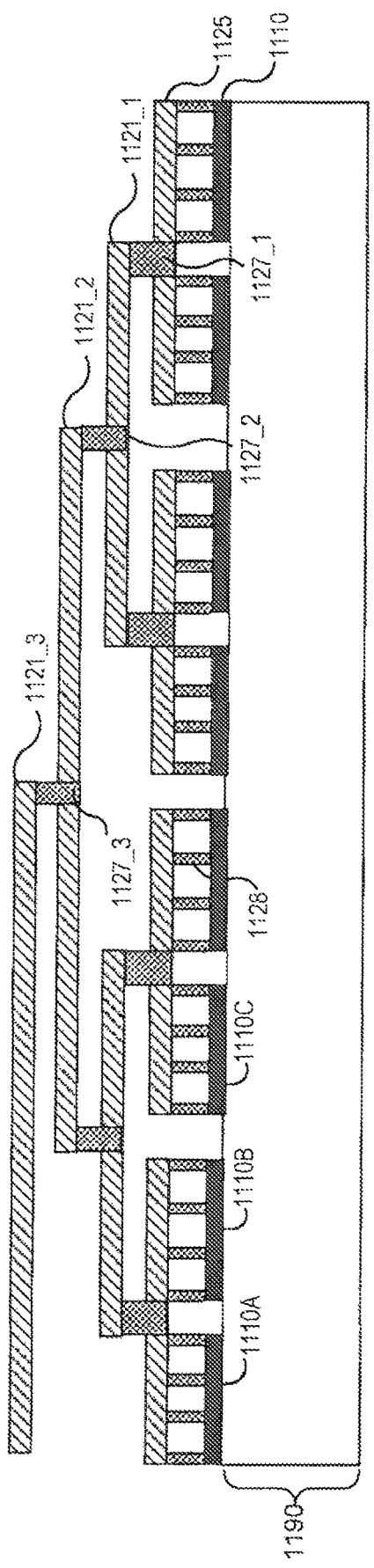
FIG. 11 is a cross section illustrating a transistor device in which multiple gate runners are utilized, according to some embodiments of the invention.

FIG. 11 is a cross section illustrating a transistor device in which multiple gate runners are utilized, according to some embodiments of the invention. In some embodiments, additional conductor layers (e.g., gate runners) may be used in a branch-out form as shown in FIG. 11. In some embodiments, the branch-out may be symmetric. The number of conductor layers can be expanded to allow for more branches, enabling shorter fingers to be used while producing the same desired gate periphery. For example, as illustrated in FIG. 11, a gate finger 1110 may be separated into a number of gate finger segments 1110A, 1110B, 1110C, etc. As discussed herein with respect to FIGS. 6B and 7, the gate finger segments 111A, 1110B, 1110C may be separated from one another or may be integrated.

The gate finger 1110 may be further coupled to a gate interconnect 1125 by a plurality of first conductive gate vias 1128. In some embodiments, gate interconnect 1125 may be at a higher level than the gate finger 1110. In some embodiments, the gate interconnect 1125 may have a greater dimension in the first direction (e.g., in the Y-direction) than the gate finger 1110. The gate linger 1110 may be connected to a semiconductor structure 1190 in a manner similar to the semiconductor structure 690 of FIGS. 6A-C.

The gate interconnect 1125 may be further connected to a first gate runner 1121_1 by a plurality of second conductive gate vias 1127_1. The first gate runner 1121_1 may be at a higher level than the gate interconnect 1125. In some embodiments, the gate runner 1121_1 may have a greater dimension in the first direction (e.g., in the Y-direction) than the gate interconnect 1125. In some embodiments, the gate interconnect 1125 may be in segments. For example, the gate interconnect 1125 may be separated into a plurality (e.g., 4) segments that may be physically isolated from one another. Each of the segments of the gate interconnect 1125 may be connected to the first gate runner 1121_1 by one of the plurality of second conductive gate vias 1127_1 that is placed at an interior position of the segment of the gate interconnect 1125. In some embodiments, the interior position of the segment of the gate interconnect 1125 may be a midpoint of the segment of the gate interconnect 1125.

The first gate runner 1121_1 may be further connected to a second gate runner 1121_2 by a plurality of third conductive gate vias 1127_2. The second gate runner 1121_2 may be at a higher level than the first gate runner 1121_1. In some embodiments, the second gate runner 1121_2 may have a greater dimension in the first direction (e.g., in the Y-direction) than the first gate runner 1121_1. The second gate runner 1121_2 may be further connected to a third gate runner 1121_3 by a fourth conductive gate via 1127_3. The third gate runner 1121_3 may be at a higher level than the second gate runner 1121_2. In some embodiments, the third gate runner 1121_3 may have a greater dimension in the first direction (e.g., in the Y-direction) than the second gate runner 1121_2. In this way, a device with three layers of gate runners 1121_1, 1121_2, 1121_3 may be constructed.

In some embodiments, each gate runner layer may be connected to an adjacent lower layer below it by a conductive via positioned at an interior position of the adjacent lower layer. For example, the third gate runner 1121_3 may be connected to the second gate runner 1121_2 by the fourth conductive gate via 1127_3 that is placed at an interior position of the second gate runner 1121_2. In some embodiments, the interior position may be a midpoint of the second gate runner 1121_2. In some embodiments, the interior position may be at a distance that is within ten percent of the length of the gate runner layer from the midpoint of the gate runner layer. In some embodiments, the interior position may be at a distance that is within twenty percent of the length of the gate runner layer from the midpoint of the gate runner layer. In some embodiments, the interior position may be at a distance that is between one-third and two-thirds of the distance between a first end and a second end of the gate runner layer.

As illustrated in FIG. 11, some of the stacked gate runner layers may be in segments. For example, the first gate runner 1121_1 may be separated into two segments that may be physically isolated from one another. Each of the segments of the first gate runner 1121_1 may be connected to the second gate runner 1121._2 by one of the plurality of third conductive gate vias 1127_2 that is placed at an interior position of the segment. In some embodiments, the interior position of the segment of the first gate runner 1121_1 is a midpoint of the segment. In some embodiments, the first gate runner 1121_1 may be a unitary layer. In addition, though FIG. 11 illustrates three gate runners 1121_1, 1121_2, and 1121_3 it will be understood that more or fewer gate runners and/or layers may be provided without exceeding the scope of the invention.

The invention described herein is technology independent, which means it can be applied for LDMOS, GaN, and other high-power RF transistor technologies. While embodiments of the present invention are illustrated with reference to a LDMOS and HEMT structures, the present inventive concepts are not limited to such devices. Thus, embodiments of the present invention may include other transistor devices having a plurality of unit cells and a controlling electrode. Embodiments of the present invention may be suitable for use in any transistor device where a wider controlling electrode is desired and multiple unit cells of the device are present. Thus, for example, embodiments of the present invention may be suitable for use in various types of devices, such as, MESFETs, MMICs, SITs, LDMOS, BJTs, pHEMTs, etc., fabricated using SiC, GaN, GaAs, silicon, etc.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A transistor device, comprising:
a semiconductor structure;
a plurality of drain fingers extending on the semiconductor structure in a first direction;
a plurality of drain interconnects that each have a first end and a second end extending on the semiconductor structure in the first direction, wherein each drain interconnect is connected to a respective drain finger by a plurality of first conductive vias; and
a plurality of drain runners extending on the semiconductor structure in the first direction,
wherein at least one of the drain interconnects is connected to one of the drain runners by a second conductive via at an interior position of the at least one drain interconnect that is remote from the first end and the second end of the at least one drain interconnect.

2. The transistor device of claim 1, wherein respective ones of the drain fingers are configured to act as a drain electrode for the transistor device.

3. The transistor device of claim 1, wherein the drain fingers extend on the semiconductor structure at a first level above the semiconductor structure, the drain interconnects extend on the semiconductor structure at a second level above the semiconductor structure that is higher than the first level, and the drain runners extend on the semiconductor structure at a third level above the semiconductor structure that is higher than the second level.

4. The transistor device of claim 1, wherein the interior position of the at least one drain interconnect is between one-third and two-thirds of a distance between the first end and the second end of the at least one drain interconnect.

5. The transistor device of claim 1, wherein the interior position of the at least one drain interconnect is at a halfway point between the first end and the second end of the at least one drain interconnect.

6. The transistor device of claim 1, wherein a first of the drain fingers comprises a first segment and a second segment, with a gap therebetween.

7. The transistor device of claim 6, wherein the interior position of the at least one the drain interconnects vertically overlaps the gap.

8. The transistor device of claim 1, further comprising a drain manifold on the semiconductor structure that is connected to the drain runners, wherein the drain manifold extends on the semiconductor structure in a second direction crossing the first direction.

9. The transistor device of claim 1, further comprising a plurality of drain regions on the semiconductor structure,
wherein the plurality of drain fingers are respectively on the plurality of drain regions, and
wherein respectively ones of the plurality of drain regions are a shared drain region for two adjacent transistor cells of the transistor device.

10. A transistor device, comprising:
a semiconductor structure;
a drain region on the semiconductor structure;
a drain finger extending at a first level above the semiconductor structure on the drain region; and
a drain interconnect on the semiconductor structure at a second level above the semiconductor structure that is higher than the first level, wherein the drain interconnect is connected to the drain finger by a plurality of first conductive vias and configured to be coupled to a drain signal at an interior position of the drain interconnect.

11. The transistor device of claim 10, further comprising:
a drain runner on the semiconductor structure at a third level above the semiconductor structure, wherein the drain runner is connected to the drain interconnect at the interior position of the drain interconnect.

12. The transistor device of claim 11, wherein the third level is higher than the second level.

13. The transistor device of claim 11, wherein a width of the drain runner exceeds a width of the drain interconnect.

14. The transistor device of claim 10, wherein the interior position is between one-third and two-thirds of a distance between a first end and a second end of the drain interconnect.

15. The transistor device of claim 10, wherein the drain region is one of a plurality of drain regions, the transistor device further comprising:
a plurality of source regions alternately arranged with the plurality of drain regions on the semiconductor structure; and
a plurality of gate fingers extending respectively above the semiconductor structure between adjacent ones of the source regions and the drain regions.

16. The transistor device of claim 10, wherein the drain finger comprises a first segment and a second segment, with a gap therebetween.

17. A transistor device, comprising:
- a semiconductor structure;
- a gate finger extending on the semiconductor structure in a first direction; and
- a gate interconnect extending in the first direction and configured to be coupled to a gate signal at an interior position of the gate interconnect, the gate interconnect electrically coupled to the gate finger,
- wherein the gate interconnect has a first end and a second end,
- wherein current received at the first end of the gate interconnect has less than 1 degree phase difference from current received at the second end of the gate interconnect.

18. The transistor device of claim 17, further comprising a gate runner on the semiconductor structure and connected to the interior position of the gate interconnect,
- wherein a first dimension of the gate runner in a second direction that crosses the first direction exceeds a second dimension of the gate interconnect in the second direction.

19. The transistor device of claim 17, wherein the interior position of the gate interconnect is between one-third and two-thirds of a distance between the first end and the second end of the gate interconnect.

20. The transistor device of claim 17, wherein the gate finger comprises a first segment and a second segment, with a gap therebetween.

* * * * *

UNITED STATES PATENT AND TRADEMARK OFFICE
CERTIFICATE OF CORRECTION

PATENT NO. : 10,748,996 B2
APPLICATION NO. : 16/596240
DATED : August 18, 2020
INVENTOR(S) : Mokhti et al.

Page 1 of 1

It is certified that error appears in the above-identified patent and that said Letters Patent is hereby corrected as shown below:

In the Specification

Column 13, Line 1: Please correct "6101" to read -- 610B --

Column 15, Line 18: Please correct "111A" to read -- 1110A --

Column 16, Line 17: Please correct "1121._2" to read -- 1121_2 --

Signed and Sealed this
Twenty-second Day of December, 2020

Andrei Iancu
*Director of the United States Patent and Trademark Office*